United States Patent [19]

Pietrzyk

[11] Patent Number: 5,061,908

[45] Date of Patent: Oct. 29, 1991

[54] EMITTER-COUPLED MULTIVIBRATOR CIRCUIT INDEPENDENT OF TEMPERATURE AND SUPPLY VOLTAGE

[75] Inventor: Michael Pietrzyk, Hamburg, Fed. Rep. of Germany

[73] Assignee: U.S. Philips Corporation, New York, N.Y.

[21] Appl. No.: 554,632

[22] Filed: Jul. 17, 1990

[30] Foreign Application Priority Data

Jul. 19, 1989 [DE] Fed. Rep. of Germany ....... 3923823

[51] Int. Cl.$^5$ ........................................... H03K 3/283
[52] U.S. Cl. ................................. 331/113 R; 331/144
[58] Field of Search ........................... 331/113 R, 144

[56] References Cited

U.S. PATENT DOCUMENTS

| | | | |
|---|---|---|---|
| 3,582,809 | 6/1971 | Rigby | 331/113 R X |
| 3,904,989 | 9/1975 | Cordell | 331/113 R |
| 4,717,892 | 1/1988 | Hitomi | 331/113 R |
| 4,803,445 | 2/1989 | Yamasaki | 331/113 R X |

Primary Examiner—Siegfried H. Grimm
Attorney, Agent, or Firm—Bernard Franzblau

[57] ABSTRACT

An emitter-coupled multivibrator circuit independent of temperature and supply voltage includes an oscillator circuit (11), a current control circuit (12) and a supply voltage circuit (13) for producing at least one reference voltage. The oscillator circuit consists of two switching transistors (15,16), each with a collector coupled to a respective collector-emitter branch of two interception transistors (37,38) for a lower threshold voltage and of two interception transistors (35,36) for a higher threshold voltage and, to respective active loads (28,29) of the current control circuit (12). The loads (28,29) are associated with a current mirror branch (31) including transistors (30,34) and a current source (32,33). The bases of the interception transistors (37,38) are connected to a reference voltage $U_{b2}$ and those of the interception transistors (35,36) are connected to the emitter of the transistor (34). The emitter surface of the transistor (30) exceeds by a factor P that of one of the interception transistors (35 and 36) and that of the transistor (34) exceeds by a factor N that of one of the interception transistors (37 and 38). The product of the factors N and P is constant. The voltage supply circuit insures that the oscillation frequency f is independent of the supply voltage.

19 Claims, 1 Drawing Sheet

EMITTER-COUPLED MULTIVIBRATOR CIRCUIT INDEPENDENT OF TEMPERATURE AND SUPPLY VOLTAGE

BACKGROUND OF THE INVENTION

This invention relates to an emitter-coupled multivibrator circuit comprising an oscillator circuit having two switching transistors, a current control circuit and a voltage supply circuit for supplying at least one reference voltage.

Such circuits of a frequency-controllable oscillator, which are essentially based on the operating principle cf the emitter-coupled multivibrator and are used in the field cf bipolar integrated circuits, for example, as a voltage or current controlled oscillator (VC0 or CC0) and as a fixed oscillator in phase control circuits or as a frequency modulator, are known from German Patents P 2540867 C2 and P 3632458 C2 which corresponds to U.S. Pat. Nos. 3,904,989 and 4,717,892, respectively.

An object of these known applications is to provide oscillation frequencies that are independent of supply voltage and free from drift. For the desired freedom from drift, it is essentially required that the charge current of a capacitor and the upper and a lower threshold voltage, upon the occurrence of which the oscillator triggers, be independent of temperature, while their dependencies compensate each other.

The said patents describe ways of reducing the frequency drift of the emitter-coupled multivibrator. However, the two known techniques have the disadvantage that either they are not particularly suitable for the mass production of integrated circuits or they require extremely complex networks.

For example, DE PS 2540867 C2 discloses a temperature-compensated emitter-coupled multivibrator circuit having two switching transistors, a time control capacitor between the emitter electrodes of these switching transistors and two current sources connected between the emitter electrodes of the switching transistors and a fixed potential. The supplied current is controlled by a reference voltage, while a complicated device for controlling the collector currents of the switching transistors is provided in such a manner that the multivibrator triggers when the voltage across the time control capacitor is substantially equal to the depletion layer voltage of the semiconductor junction at a current flow which is equal to the predetermined multiple of a current supplied by the first and second current sources. This circuit moreover has a further complicated device for producing a reference voltage for the current sources such that the reference voltage is substantially equal to the depletion layer voltage of the semiconductor junction. Such a principle circuit is already extremely complex. However, it becomes even more complicated when a voltage control for linearly varying the frequency of the multivibrator under the same or more favorable temperature conditions is desired. A corresponding circuit then aims at a reduction of the temperature-dependent base current variations, which occur because of temperature-dependent variations of the transistor current amplifications. As suitable principles two methods are used, i e. the reduction of the transistor base current by the use of Darlington transistors and the addition of circuits for deriving or supplying a temperature-dependent current for base current compensation, i.e. a compensation current which is substantially equal to the troublesome temperature-dependent base current. Such a circuit is then so complex that, although it is still suitable for mass production of integrated circuits, it is so very complicated that disturbances are to be expected.

SUMMARY OF THE INVENTION

An object of the invention is to provide an emitter-coupled multivibrator circuit for producing an adjustable oscillator frequency which is independent of variations of temperature and supply voltage, has a small number of elements and is particularly suitable for mass production in the integrated circuit technology.

According to the invention, this object is achieved in that the collectors of the switching transistors are each coupled to a collector-emitter branch of two first interception transistors for a lower threshold voltage, to a collector-emitter branch of two second interception transistors for a higher threshold voltage and to an active load, the interception transistors and the load being parts of the current control circuit and a current mirror branch having at least a first and a second transistor and having a current source being associated with the load, in that the first interception transistors are coupled tc the voltage supply circuit for receiving a reference voltage and the second interception transistors are coupled to an emitter of the second transistor cf the current mirror branch, in that emitter surfaces cf the interception transistors are pairwise in a ratio to emitter surfaces Of the transistors of the current mirror branch and in that the voltage supply circuit is adapted to supply the at least one reference voltage for generating an oscillation frequency substantially independent of supply voltages.

In an oscillator circuit, in which the switching transistors are interconnected on the emitter side through a capacitor and are connected each through a current source comprising a transistor and a resistor to the ground terminal of a supply voltage and which further has level shift transistors, which are crosswise coupled to the switching transistors and whose collectors are connected tc the voltage source and whose emitters are each connected to a base of the switching transistors and are further connected to ground through a current source comprising transistor and a resistor, the bases of the current source transistors being connected to a reference voltage, the oscillator frequency is determined by the value of the charge and discharge current through the switching transistors and, for example, preceding resistors, by the value of the capacitor and by a given difference between two driving and threshold voltage values, respectively, for triggering the oscillator according to the following equation:

$$f = I_o/(2U_H C) \tag{1}$$

In this equation, $I_o$ is the value of the discharge and charge current, C is the capacitance of the capacitor and $U_H$ is the admissible difference between the threshold voltage values.

For the difference $U_H$ between the threshold voltage values an approximation equation can be derived, which indicates the value of the threshold voltage $U_H$ in dependence upon the circuit parameters cf the oscillator circuit.

$$U_H \approx 2RI_o - 2U_T \ln(2eRI_o/U_T) \tag{2}$$

Therein R is the value of each time a resistor, which is connected, for example, between each collector of the switching transistors and the plus terminal of the supply voltage, e is the base of the natural logarithm and $U_T$ is obtained from:

$$U_T = k\,T/q \tag{3}$$

wherein k is the Boltzmann constant, T is the temperature in Kelvin and q is the electrical charge unit. This makes it clear that with a temperature-independent current $I_o$ and a temperature-independent capacitor, which is approximately indeed the case, the oscillator frequency is determined by the temperature drift of the difference $U_H$ between the threshold voltage values according to the equation (2) and is consequently not temperature-independent.

Due to the fact that the switching transistors work, according to the characteristic features of the invention not with resistors, hut with active loads, more particularly with transistors of the current control circuit, and since the emitter surface of the second transistor in the current mirror branch exceeds by a factor N each of the same emitter surfaces of the first interception transistors coupled on the collector side with a supply voltage terminal and that the emitter surface of the first transistor in the current mirror branch exceeds by a factor P each of the same emitter surfaces of the second interception transistors coupled to ground on the collector side, the temperature independence of the difference $U_H$ of the threshold voltage value can be obtained in an advantageous manner.

It is particularly advantageous when the product of the factors N and P corresponds to a constant vague, more particularly to a value 11, as a result of which the temperature independence can be guaranteed. It is further particularly advantageous when the second transistor of the current mirror branch is connected as a diode and the first transistor has a base-collector connection and the current source of the current mirror branch is composed of the series arrangement of a transistor and a resistor, the resistor being coupled to ground and the emitter of the first transistor being connected to the voltage source. Further it is advantageous when the active loads, the first transistor of the current mirror branch acting as a current mirror and the second interception transistors are PNP transistors and the first interception transistors, the second transistor of the current mirror branch and the transistor serving as a current source are NPN transistors. It should be noted here that in the aforementioned case all of the transistors of the multivibrator circuit not indicated further are NPN transistors.

It is further particularly advantageous when the voltage supply circuit for producing a reference voltage has a resistance divider for dividing the supply voltage, and which comprises several resistors.

The voltage across the first resistor serves as a reference voltage for the bases of the first interception transistors of the current control circuit and the voltage across a last resistor of this resistance voltage divider serves as a connection for a voltage/current converter, ultimately for producing a reference voltage for the current sources of the oscillator circuit and of the current control circuit.

Thus, it is ensured that the frequency of the oscillator circuit is independent of the supply voltage. Except for a resistor of the voltage supply circuit, the whole circuit can be realized so as to be monolithically integrated.

The externally provided resister can then serve to compensate the oscillator frequency.

Further preferred embodiments of the emitter-coupled multivibrator circuit according to the invention are described in the dependent claims. An embodiment of the invention will now be described more fully with reference to the accompanying drawing.

BRIEF DESCRIPTION OF THE DRAWINGS

The sole FIG. 1 of this drawing shows an emitter-coupled multivibrator circuit independent of temperature and supply voltage.

DESCRIPTION OF THE PREFERRED EMBODIMENTS

Figure 1:
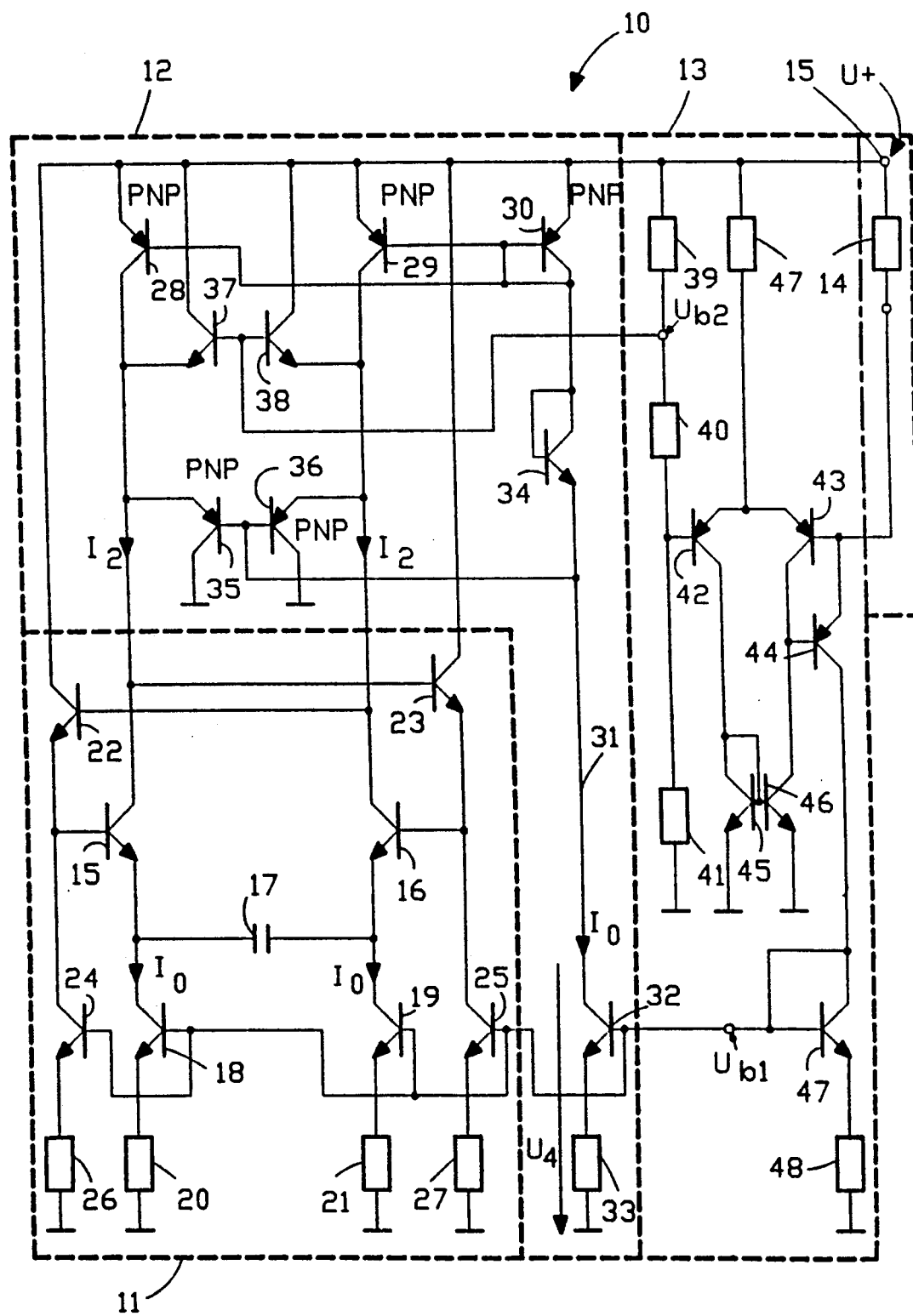

The multivibrator circuit 10 according to the invention shown in FIG. 1 is essentially composed of three sub-circuits, i.e. an oscillator circuit 11, a current control circuit 12 and a voltage supply circuit 13. A resistor 14 is arranged externally of the voltage supply circuit 13 and serves, inter alia, for the compensation of the voltage supply circuit 13. The plus terminal of a supply voltage U is connected tc its upper pin 15. The resistor 14 is preferably proportioned so that it has a negligible temperature drift. It further constitutes an external resistor of the multivibrator circuit 10, which, for example, is designed so as to be otherwise integrated.

The oscillator circuit 11 is essentially composed in a known manner. It has two switching transistors 15 and 16, which are interconnected on the emitter side through a capacitor 17 and are each connected to ground through a current source comprising a series arrangement of a transistor 18 and 19, respectively, and a resistor 20 and 21, respectively. The oscillator circuit 11 further comprises cross-coupled level shift transistors 22 and 23, which are correspondingly connected to the switching transistors 15 and 16 and are connected to ground on the emitter side eacb through a current source comprising a transistor 24 and 25, respectively, and a resistor 26 and 27, respectively. The respective base electrodes of the transistors 18, 19, 24 and 25 are connected to a reference voltage source $U_{b1}$. The collectors of the level shift transistors 22 and 23 are connected, for example, through the current control circuit 12 and the voltage supply circuit 13 directly to the supply voltage U.

In order to insure a temperature-independent difference $U_H$ of the threshold voltage values for triggering the switching transistors 15 and 16, respectively, the collectors of the switching transistors 15 and 16 are introduced into the current control circuit 12 and are coupled there as to active loads 28 and 29, respectively. These active loads 28 and 29 are preferably in the form of PNP current source transistors and are connected on the emitter side to the supply voltage U. The collector of the switching transistor 15 therefore works with the collector of the load transistor 28 and the collector of the switching transistor 16 works with the collector of the load transistor 29. Together with a transistor 30 in a current mirror branch 31, the load transistors 28 and 29 constitute a current mirror. By means of a current source consisting of a series arrangement comprising a transistor 32 and a resistor 33 in the current mirror branch 31, a reference current $I_o$ is adjusted. In the current mirror branch 31, a second transistor 34 is arranged, which is connected as a diode. The series arrangement comprising the first transistor 30 and the second transistor 34 of the current mirror branch 31 supplies the base potential for the second interception transistors 35 and 36 for an upper threshold voltage value. These interception transistors 35 and 36 therefore define the upper value of the voltage sweep $U_H$ at the collectors of the switching transistors 15 and 16 of the oscillator circuit 11. The first interception transistors 37 and 38 serve to adjust the lower value. The base potential thereof is adjusted by a reference voltage source $U_{b2}$ of the voltage supply circuit 13. The combined functional action of the circuit components described thus far is as follows. With identical transistors 28, 29 and 30, a current is obtained in the collectors of transistors 28, 29, each of which corresponds to the reference current $I_o$.

When first it is assumed that the switching transistor 15 is conducting and transistor 16 is cut off, a current of approximately 2 $I_o$ flows through the switching transistor 15. The load transistor 28 supplies only a current of $I_o$ so that the residual current must flow through one of the lower interception transistors, i.e. the interception transistor 37. The interception transistor 37 therefore becomes conductive and the interception transistor 35 of the upper interception transistors is cut off. Since the switching transistor 16 is assumed to be cut off, it therefore conveys approximately a zero current. The collector current $I_o$ of the load transistor 29 therefore flows through the interception transistor 36. The interception transistor 36 becomes conductive and the interception transistor 38 is cut off. In the opposite case where the switching transistor 15 is cut off and the switching transistor 16 is conductive, the condition of the transistors 35–37 are reversed in a corresponding manner.

According to the theory, the emitter-coupled multivibrator changes its switching condition when the loop amplification is unity. In this point the current ratio $z = I_o/I_2$ can be indicated by a cubic equation of the following form:

$$(I_o/I_2)^3 - 4(I_o/I_2)^2 + 4(I_o/I_w) - 1 = 0 \qquad (4)$$

wherein $I_2$ is the current through the cut-off switching transistor of the multivibrator. Of the three mathematical solutions of the equation (4) only the following makes sense in physical respect.

$$z = I_o/I_2 = (3 + \sqrt{5})/2 \qquad (5)$$

The threshold voltage difference $U_H$ of the circuit arrangement comprising the oscillator circuit 11 and the current control circuit 12 therefore corresponds to the expression $$U_H = 2(U_4 - U_{b2}) + 2U_T \ln(I_o^2(1-1z)^2/(z(2-1/z)I_{sp}I_{SN})) \qquad (6)$$

Wherein $I_{SP}$ is the saturation current of the PNP transistors 35 and 36 respectively, and $I_{SN}$ is the saturation current of the NPN transistor 37 and 38, respectively, and the voltage $U_4$ is the voltage across the current source in the current mirror branch 31. When the equation (5) is substituted into the equation (6), the following equation is obtained:

$$U_H \approx 2(U_4 - U_{b2}) + 2U_T \ln(0.09 I_o^2/I_{SP}I_{SN})) \qquad (7)$$

The equation (7) is not yet temperature-independent. This can be attained by an opposite temperature dependence of the expression $U_4 - U_{b2}$. Advantageously, this is ensured in that the emitter surface of the first transistor 30 in the current mirror branch 31 exceeds by the factor P the respective emitter surface of the second interception transistors 35 and 36, respectively, and the emitter surface of the second transistor 34 in the current mirror branch 31 exceeds by the factor N the respective emitter surface of the interception transistors 37 and 38, respectively. For the expression $U_4-U_{b2}$, the following equations are obtained:

$$U_4 - U_{b2} = U - U_{BE30} - U_{BE34} - U_{b2} \qquad (8)$$

$$U_4 - U_{b2} = U - U_{b2} - U_T\ln(I_o^2/(PNI_{SP}I_{SN})) \qquad (9)$$

By substitution of the equation (9) into the equation (7), there is obtained:

$$U_H \approx 2(U - U_{b2}) + 2U_T\ln(0.09 PN) \qquad (10)$$

The equation (10) becomes temperature-independent when it holds that:

$$PN = 1/0.09 \approx 11 \qquad (10a)$$

By a suitable choice of the emitter surfaces of the transistors 30 and 34, a threshold value voltage difference $U_H$ can therefore be produced which is temperature-independent.

As already mentioned above, for an oscillator frequency free from drift, not only the threshold value voltage difference $U_H$, but alas the current $I_o$ must be temperature-independent. It should be noted here that the temperature drift of the capacitor 17 is negligible.

In order that ultimately also the current $I_o$ be temperature-independent, the voltage supply circuit 13 supplies two reference voltages $U_{b1}$ and $U_{b2}$. It should be noted here that the resistor 14 belongs to the voltage supply circuit 13, it is true, but is not realized so as to be integrated. In the voltage supply circuit 13, the reference voltage $U_{b2}$ is obtained by means of a resistance voltage divider comprising the resistors 39, 40 and 41 connected to the supply voltage U. The reference voltage $U_{b2}$ is derived between the resistors 39 and 40. It holds that:

$$U_H = 2(U - U_{b2}) \text{ with } U_{b2} = \alpha U, \qquad (11)$$

$$= 2U(1 - \alpha) \qquad (12)$$

The current $I_o$ is obtained by means of a voltage/current converter. As a voltage/current converter use is made of an operational amplifier feed back negatively and comprising the transistors 42, 43, 44, 45 and 46 as well as the resistor 47, which connects the emitters of the transistors 42 and 43 to the supply voltage U. The base of the transistor 42 is connected between the resistors 40 and 41. The collector of the transistor 42 is connected through the transistor 45 to ground and to its base, which is in turn connected to the base of the transistor 46. The collector of the transistor 43 is connected through the transistor 46 to ground and drives the base of the transistor 44. The base of the transistor 43 is connected to the resistor 14 and through the transistor 44 to a transistor 47, whose emitter is connected to ground through a resistor 48. The transistor 47 is connected as a diode. At its base the reference voltage $U_{b1}$ is available. This voltage is supplied to the base electrode of the current source transistors 18, 19, 24, 25 and 32.

The voltage/current converter converts the voltage $\alpha U$ occurring across the resistors 40 and 41 into the reference voltage $\beta U$ occurring across the resistor 41 transfers it to the base of the transistor 43 and keeps it constant, independently of the current load. The current $I_o$ is therefore calculated from:

$$I_o = (U - \beta U)/R \tag{13}$$

Wherein R is the resistance value of the resistor 14.

For the oscillation frequency f of the oscillator, there is obtained by substitution of the equation (12) and the equation (13) into the equation (1):

$$f = (U - \beta U)/(4U(1-\alpha)CR) \tag{14}$$

$$f = (1-\beta)/(4(1-\alpha)CR) \tag{15}$$

The equation (15) is independent of the supply voltage U so that at the oscillation frequency an emitter-coupled multivibrator circuit independent of temperature and supply voltage comprising a small number of elements is available.

The features of the invention indicated in the above description, in the Figure and in the claims, contribute to the realization of the invention in its various embodiments.

I claim:

1. An emitter-coupled multivibrator circuit comprising: an oscillator circuit having two switching transistors, a current control circuit and a voltage supply circuit for supplying at least one reference voltage, characterized in that collectors of the switching transistors are each coupled to a respective collector-emitter branch of two first interception transistors for a lower threshold voltage, to a respective collector-emitter branch of two second interception transistors for a higher threshold voltage and to a respective active load, the interception transistors and the loads being a part of the current control circuit, a current mirror branch having at least a first and a second transistor and a current source and being coupled to the load, in that the first interception transistors are coupled to the voltage supply circuit to receive a reference voltage ($U_{b2}$) and the second interception transistors are coupled to the second transistor of the current mirror branch, in that emitter surfaces of the interception transistors are pairwise in a ratio to emitter surfaces of the first and second transistors of the current mirror branch and in that the voltage supply circuit supplies at least one reference voltage ($U_{b1}$, $U_{b2}$) for generating an oscillation frequency (f) substantially independent of supply voltages.

2. A multivibrator circuit as claimed in claim 1, wherein the emitter surface of the second transistor of the current mirror branch exceeds by a factor N each of the emitter surfaces of the first interception transistors, means coupling collectors of the first interception transistor to a supply voltage terminal, and wherein the emitter surface of the first transistor of the current mirror branch exceeds by a factor P each of the emitter surfaces of the second interception transistors, collectors of the second interception transistors being coupled to ground.

3. A multivibrator circuit as claimed in claims 1 or 2, wherein the product of the factors N and P corresponds to a value 11 thereby to insure the temperature independence of a threshold voltage difference value $U_H$ of the oscillator circuit.

4. A multivibrator circuit as claimed in claim 3, wherein the second transistor of the current mirror branch is connected as a diode, the first transistor has a base-collector connection and the current source of the current mirror branch comprises a series arrangement of a further transistor and a resistor which is coupled to ground.

5. A multivibrator circuit as claimed in claim 4, wherein in the current control circuit, the active load, the first transistor and the second interception transistors are PNP transistors and the first interception transistors, the second transistor and the further transistor are NPN transistors.

6. A multivibrator circuit as claimed in claims 1 or 2 wherein emitters of the switching transistors are interconnected via a capacitor and are coupled to ground each through a respective current source comprising a transistor and a resistor, wherein cross-coupled level shift transistors are connected to the switching transistors with collectors of said level shift transistors being coupled to the supply voltage terminal and emitters thereof being connected each to a respective base of a switching transistor and being coupled to ground each through a respective current source comprising a transistor and a resistor, and means coupling a reference voltage ($U_{b1}$) to base electrodes of the current source transistors.

7. A multivibrator circuit as claimed in claims 1 or 2 wherein the voltage supply circuit includes a resistance voltage divider comprising first, second and third resistors for producing the reference voltage ($U_{b2}$) between the first and second resistors, and means for connecting a voltage/current converter between the second and third resistors for producing a further reference voltage ($U_{b1}$).

8. A multivibrator circuit as claimed in claim 7, wherein the voltage/current converter comprises an operational amplifier with negative feedback and having third and fourth transistors interconnected on the emitter side and connected to the supply voltage terminal via a fourth resistor, wherein the base of the third transistor is connected between the second and third resistors and its collector is coupled to ground via a fifth transistor connected as a diode, and wherein the collector of the fourth transistor is connected to the base of a sixth transistor and to ground via a seventh transistor whose base is connected to the base of the fifth transistor, and wherein the base of the fourth transistor is connected via a fifth resistor to the supply voltage terminal and to the emitter of the sixth transistor whose collector is connected to ground via an eighth transistor and a sixth resistor, the further reference voltage ($U_{b1}$) being available at the base of the eighth transistor, which base is connected to the collector of the eighth transistor.

9. A multivibrator circuit as claimed in claim 8, wherein emitters of the switching transistors are interconnected via a capacitor and are coupled to ground each through a respective current source comprising a transistor and a resistor, wherein cross-coupled level shift transistors are connected to the switching transistors with collectors of said level shift transistors being coupled to the supply voltage terminal and emitters thereof being connected each to a respective base of a switching transistor and being coupled to ground each through a respective current source comprising a transistor and a resistor, and wherein the base of the eighth transistor is connected to each base of the current source transistors.

10. A multivibrator circuit as claimed in claim 9, wherein a voltage of $\alpha U$ is developed across the second and third resistors and a voltage $\beta U$ is developed across the third resistor thereby to derive an oscillation frequency for the oscillator circuit of $f=(1-\beta)/(4(1-\alpha)CR_{14})$ and which is independent of the supply voltage U.

11. A multivibrator circuit as claimed in claims 1 or 2 further comprising a capacitor with negligible temperature drift interconnecting emitters of the switching transistors, wherein the voltage supply circuit includes a voltage/current converter coupled to a supply voltage terminal via a resistor, and wherein the oscillator circuit, the current control circuit and the voltage supply circuit, except for the resistor, comprise an integrated circuit wherein the resistor provides compensation of the oscillator frequency and has a negligible temperature drift.

12. An emitter-coupled multivibrator circuit comprising:
    an oscillator circuit including first and second switching transistors,
    first, second, third and fourth interception transistors each with a control electrode,
    first and second active loads,
    first means coupling said first and second switching transistors in respective series circuits with said first and second active loads to terminals of a source of supply voltage,
    second means coupling said first and second switching transistors in respective second series circuits with said first and second interception transistors to said supply voltage terminals,
    third means coupling said third and fourth interception transistors in first and second branch circuits that are parallel to said first and second switching transistors, respectively,
    a further branch circuit coupled to said first and second active loads to form therewith a current mirror circuit, said further branch circuit including first and second transistors and a current source connected in series to said supply voltage terminals,
    first means connecting the control electrodes of the first and second interception transistors to a source of reference voltage,
    second means connecting the control electrodes of the third and fourth interception transistors to the second transistor of the further branch circuit, and wherein
    the interception transistors are dimensioned relative to the first and second transistors of the further branch circuit in a predetermined ratio to make the oscillation frequency of the multivibrator circuit substantially independent of temperature and said first connecting means supplies a reference voltage such that said oscillation frequency is substantially independent of the supply voltage.

13. A multivibrator circuit as claimed in claim 12, wherein said first and second transistors of the further branch circuit are each connected as a diode.

14. A multivibrator circuit as claimed in claim 12, wherein said transistors are bipolar transistors with the emitter area of the second transistor of the further branch circuit N times the emitter area of each of the first and second interception transistors and with the emitter area of the first transistor of the further branch circuit P times the emitter area of each of the third and fourth interception transistors.

15. A multivibrator circuit as claimed in claim 14, wherein the product NP is a constant value.

16. A multivibrator circuit as claimed in claim 12 further comprising:
    a second and third current source connected in series with said first and second switching transistors, respectively, wherein each of said first, second and third current sources include a respective transistor with a control electrode, and
    a voltage/current converter coupled to said supply voltage terminals and having an output coupled to said control electrodes of the respective transistors of said current sources to supply a second reference voltage thereto.

17. A multivibrator circuit as claimed in claim 12 further comprising:
    first and second level shift transistors coupled between control electrodes of the first and second switching transistors, respectively, and one of said supply voltage terminals, and
    means coupling control electrodes of the second and first level shift transistors to output electrodes of the first and second switching transistors, respectively.

18. A multivibrator circuit as claimed in claim 12, wherein said first and second active loads each comprises a PNP transistor, and said first and second transistors of the further branch comprise a PNP and an NPN transistor, respectively.

19. A multivibrator circuit as claimed in claim 17 further comprising second and third current sources connected in series with said first and second switching transistors, respectively, and
    fourth and fifth current source connected in series with said first and second level shift transistors, respectively.

* * * * *